(12) United States Patent
Sarver et al.

(10) Patent No.: US 7,114,908 B1
(45) Date of Patent: Oct. 3, 2006

(54) METHOD AND APPARATUS FOR STACKING SEMICONDUCTOR WAFERS

(75) Inventors: Roger Sarver, Gorham, ME (US); Dennis Moffat MacDonald, Baxton, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 275 days.

(21) Appl. No.: 10/727,188

(22) Filed: Dec. 2, 2003

(51) Int. Cl.
*B65G 57/00* (2006.01)
*B26D 7/00* (2006.01)
*B65H 39/02* (2006.01)

(52) U.S. Cl. .............. 414/790.2; 414/796.2; 414/937; 414/404; 414/416.02; 414/416.08; 414/788.8; 414/802; 414/810

(58) Field of Classification Search ........... 414/937, 414/796.2, 404, 935, 416.02, 416.08, 938, 414/790.2, 789.9, 790, 793.6–793.7, 795.3, 414/802, 810, 788.8
See application file for complete search history.

(56) References Cited

U.S. PATENT DOCUMENTS

| 2,407,782 | A | * | 9/1946 | Hardy ................. 414/793.7 |
| 3,915,317 | A | * | 10/1975 | White et al. ........... 414/789.9 |
| 3,977,566 | A | * | 8/1976 | Hill et al. ................ 221/222 |
| 5,735,662 | A | * | 4/1998 | Nichols et al. ........ 414/331.16 |
| 2002/0098067 | A1 | * | 7/2002 | De Luna et al. ............ 414/404 |

* cited by examiner

*Primary Examiner*—Eileen D. Lillis
(74) *Attorney, Agent, or Firm*—Beyer Weaver & Thomas LLP

(57) ABSTRACT

An apparatus for stacking semiconductor wafers comprises a housing configured to releasably maintain a plurality of semiconductor wafers in fixed positions relative to the housing. The apparatus also includes a transfer guide proximate to the housing, the transfer guide configured to facilitate the transfer of the plurality of semiconductor wafers into the housing. Also included is a member configured to detach the semiconductor wafers from the housing so as to collect the semiconductor wafers into a stack.

12 Claims, 3 Drawing Sheets

METHOD AND APPARATUS FOR STACKING SEMICONDUCTOR WAFERS

BRIEF DESCRIPTION OF THE INVENTION

This invention relates generally to semiconductor wafer fabrication. More specifically, this invention relates to a method and apparatus for stacking semiconductor wafers.

BACKGROUND OF THE INVENTION

Cassette carriers are often used to transport finished semiconductor wafers prior to dicing. However, these carriers suffer from certain drawbacks. Current cassette carriers maintain excessive space between wafers, taking up too much volume in transport and resulting in unnecessary expense. This is especially the case in situations involving scrap wafers, when wafer-to-wafer contact is of little concern. Wafers are also subject to handling damage when they are removed from cassette carriers, resulting in reduced process yields and other inefficiencies.

Therefore, it would be highly desirable to stack wafers more compactly, so that they occupy less volume in transport. It would also be desirable to stack wafers in a manner that minimizes handling damage.

SUMMARY OF THE INVENTION

In one embodiment, an apparatus for stacking semiconductor wafers comprises a housing configured to releasably maintain a plurality of semiconductor wafers in fixed positions relative to the housing. The apparatus also includes a transfer guide proximate to the housing, the transfer guide configured to facilitate the transfer of the plurality of semiconductor wafers into the housing. Also included is a member configured to detach the semiconductor wafers from the housing so as to collect the semiconductor wafers into a stack.

In another embodiment, an apparatus for stacking semiconductor wafers comprises a housing having supports for releasably engaging a plurality of semiconductor wafers, and a basket configured to receive the plurality of semiconductor wafers. The basket is further configured to disengage the wafers from the supports, and to manipulate the wafers into a stack.

The invention also includes methods of stacking semiconductor wafers. In one such embodiment, a method of stacking semiconductor wafers comprises positioning a plurality of semiconductor wafers proximate to a housing, the housing having supports configured to releasably hold the plurality of semiconductor wafers. The plurality of semiconductor wafers is transferred into the housing so that the wafers are releasably held within the housing, and the plurality of semiconductor wafers is released from the supports so as to collect the plurality of semiconductor wafers into a stack.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
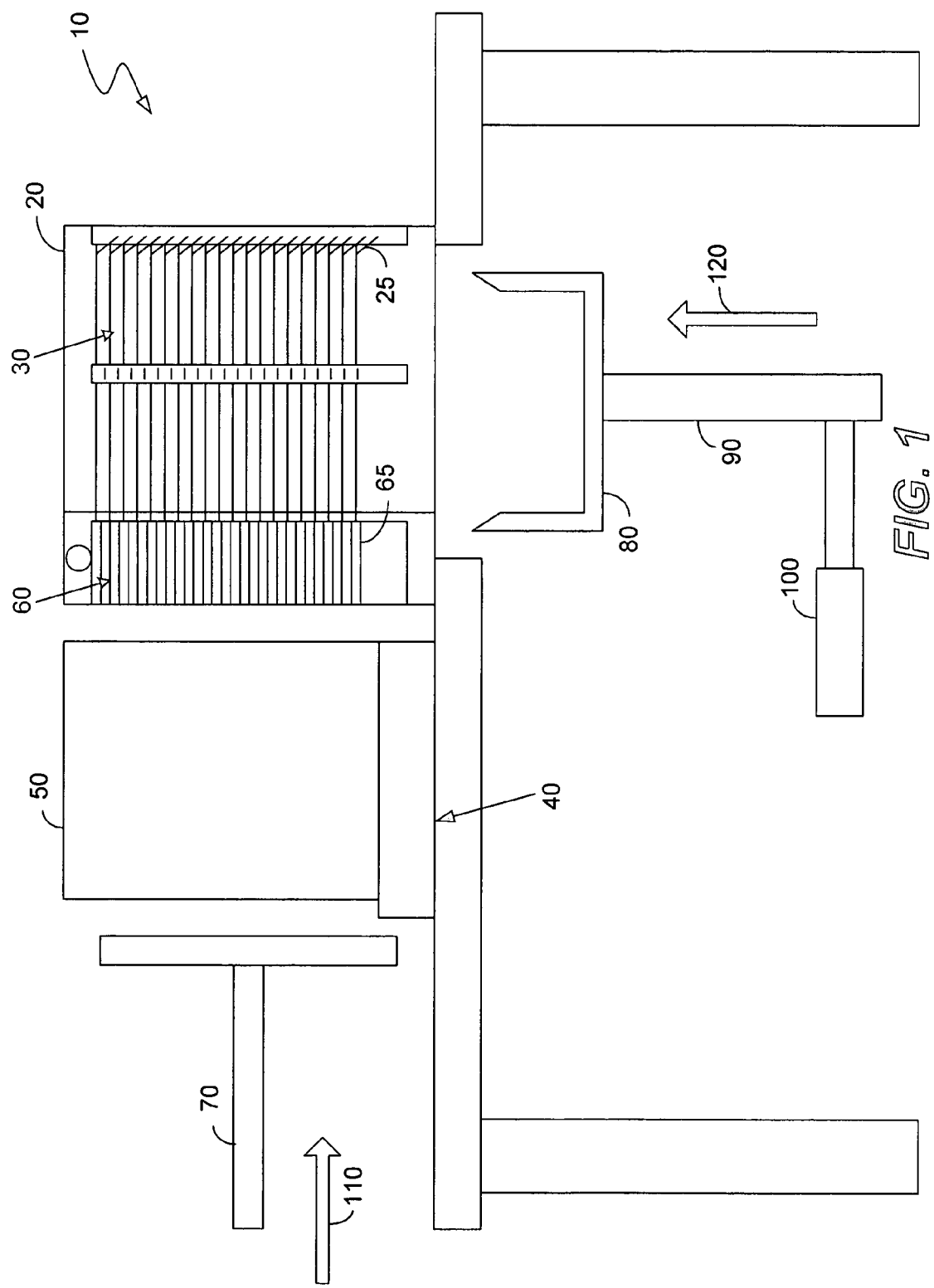
FIG. 1 illustrates a cutaway side view of a wafer stacking apparatus constructed in accordance with an embodiment of the invention.

FIG. 1 illustrates a cutaway side view of a wafer stacking apparatus constructed in accordance with an embodiment of the invention. The wafer stacking apparatus 10 includes a housing 20 sized to hold a number of semiconductor wafers 30 inside, a number of supports 25, a receptacle 40 that holds a wafer cassette 50, and a transfer guide 60. The apparatus 10 can also include a transfer arm 70, as well as a basket 80 attached to a lift 90 that is powered by a lift motor 100.

In operation, a wafer cassette 50, which can be simply a standard wafer cassette commonly used during semiconductor fabrication operations, is placed within the receptacle 40. The wafer cassette 50 holds a number of semiconductor wafers 30 and is typically designed with openings to allow the entry of a transfer arm 70. The transfer arm 70 then moves in the direction shown by the arrow 110, so as to push the wafers 30 through the transfer guide 60 and into the housing 20, where they rest on the supports 25 in fixed positions inside, and relative to, the housing 20. Once the wafers 30 are positioned on the supports 25, they can then be stacked. In this embodiment, the lift motor 100 is employed to move the lift 90 and basket 80 in the direction of the arrow 120. This moves the basket 80 through the housing 20 and in contact with the wafers 30. Continued movement of the basket 80 in the direction of the arrow then disengages the wafers 30 from the supports 25, where they then drop down into the basket 80. In this manner, the basket 80 can disengage all the wafers 30 within the housing 20, and collect them into a stack. The basket 80 and stack of wafers 30 can then be detached and removed from an opening in the housing 20, or the wafers 30 can simply be removed and the basket 80 returned to its original position in preparation for another batch of wafers.

Figure 2:
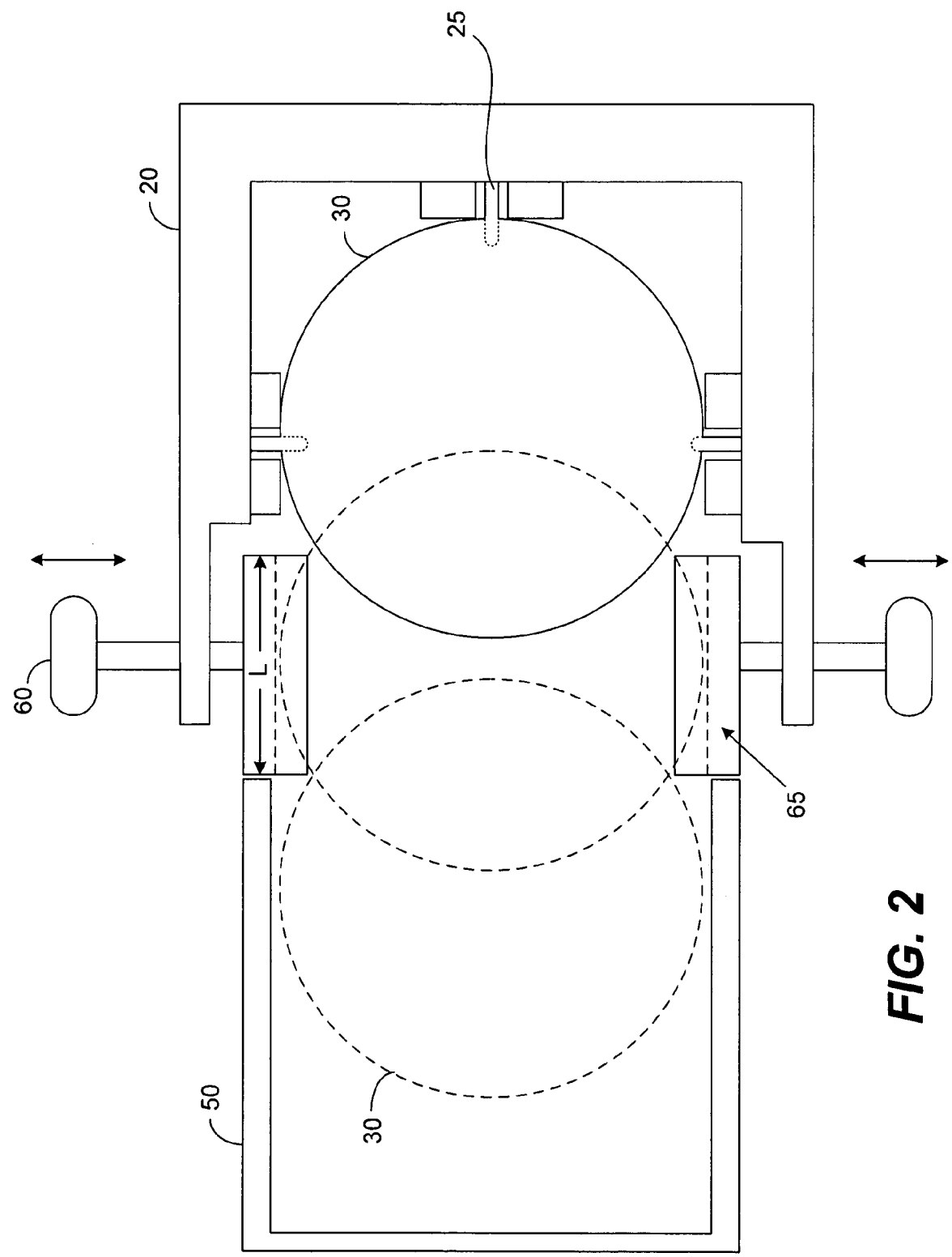
FIG. 2 illustrates a top view of a wafer stacking apparatus constructed in accordance with an embodiment of the invention.

FIG. 2 illustrates a top view of the wafer stacking apparatus 10, which further highlights the operation of the transfer guide 60 and supports 25. In one embodiment, the transfer guide 60 simply provides a set of slots 65 of sufficient length L to keep the wafers 30 oriented generally (in this embodiment) horizontally as they are slid from the wafer cassette 50 into the housing 20. In this manner, the slots 65 act to direct each wafer 30 onto the correct supports 25. As the slots 65 come in direct contact with the wafers 30, they are preferably made of a material that will not damage the wafers 30. For example, any surfaces of the slots 65 that might contact a wafer 30 can be fabricated from a non-abrasive and cleanroom-compatible material such as nylon, or a cleanroom-compatible plastic. The slots 65 and supports 25 are also spaced sufficiently far apart from one another to keep the wafers 30 from contacting each other.

The supports 25 hold the wafers 30 up and in a stationary position once they are placed within the housing 20. As can be seen from FIG. 2, the supports 25 are located so as to keep wafers 30 in a fixed position, so that they do not fall out of the housing 20. In the embodiment of FIG. 2, three supports 25 are employed for each wafer 30, but the invention employs any number of supports 25 sufficient to maintain wafers 30 in fixed positions.

The supports 25 are designed to releasably contact the wafers 30, without adhering to them. The supports 25 are also designed to release the wafers 30 upon pressure applied to the wafers 30. In this manner, supports 25 hold the wafers 30 for stacking without risking handling damage.

Figure 3:
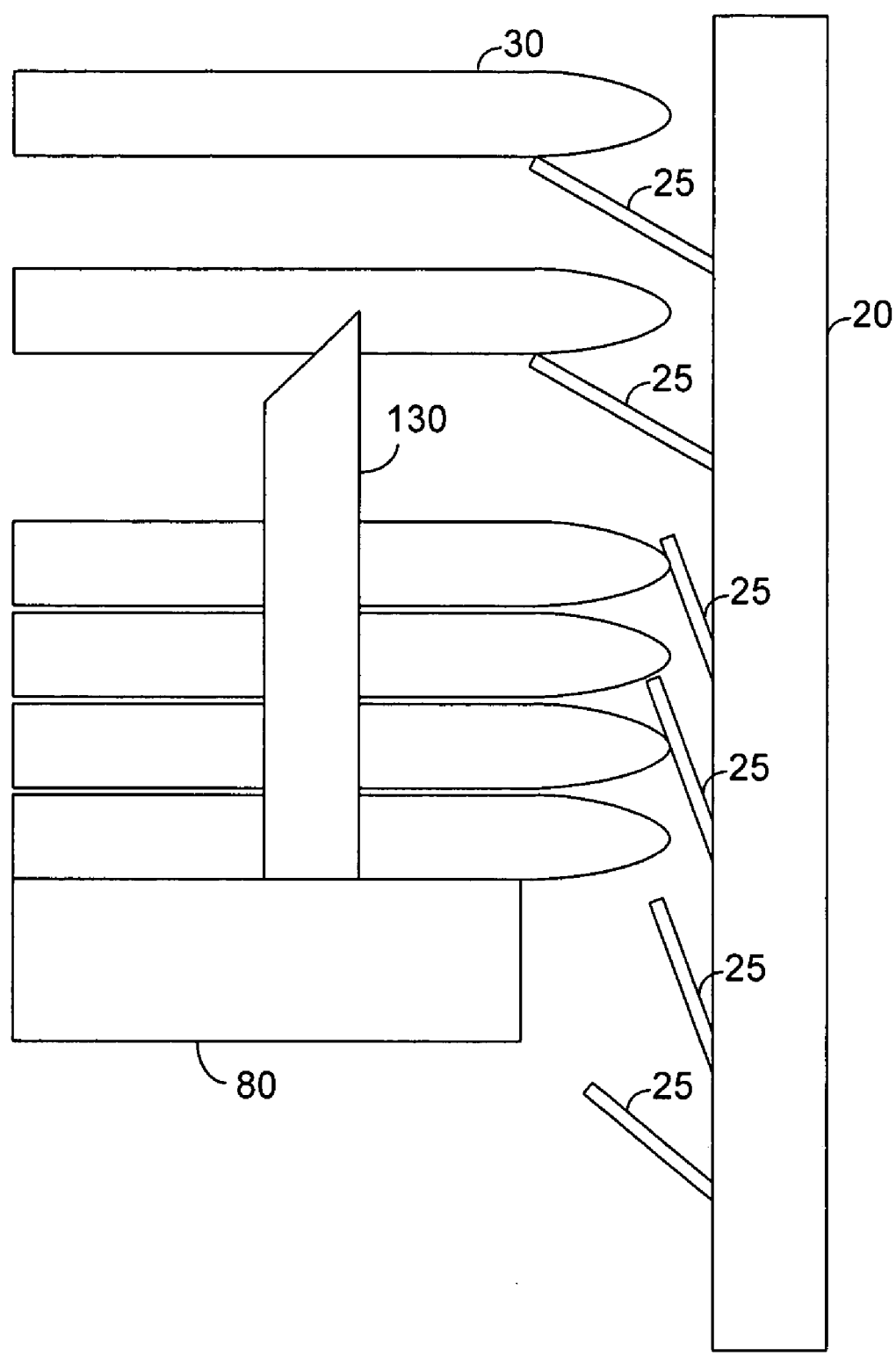
FIG. 3 illustrates a cutaway side view of a wafer stacking apparatus as operated in accordance with an embodiment of the invention.

FIG. 3 illustrates a cutaway side view of the apparatus 10, for purposes of illustrating further details of the supports 25 and how they facilitate the stacking of wafers 30. As mentioned previously, the wafers 30 are pushed from the wafer cassette 50 through the slots 65 in the wafer guide 60, and onto the supports 25 within the housing 20. Each wafer 30 then rests releasably on the supports 25. Pushing the basket 80 through the housing 20 brings it into contact with successive wafers 30, disengaging them from the supports 25 and allowing them to fall into the basket 80. The basket 80 can include guide posts 130 for manipulating the disengaged wafers 30 into a stack configuration. The invention thus acts to stack wafers into a more compact configuration than the wafer cassette 50, while subjecting them to minimal handling.

The supports 25 can take on a number of configurations while remaining within the scope of the invention. For example, the supports 25 can be made of a known flexible material such as a malleable plastic. In this configuration, the supports 25 would flexibly uphold the wafers 30, yet would yield to the basket 80 and the stacked wafers 30 when they are pushed past the supports 25. As the supports 25 in this configuration are flexible, they will typically brush past the outer edges of each wafer 30 in the stack as the basket is pushed through the housing 20. Choosing a material of sufficient pliability, such as any one of several known flexible cleanroom-compatible plastics, will allow the supports 25 to deform enough to avoid damage to the outer edges of the wafers 30. Alternatively, the supports 25 can be pivotably attached to the housing 20 so that contact with the basket 80 or stack of wafers 30 simply pivots the supports 25 away from the wafers 30. For example, the supports 25 can be designed with a hinged end close to the surface of the housing 20, so that they pivot away from the wafers 30 in response to pressure. Both the flexible and pivotable configurations of the supports 25 are contemplated by the invention.

Once the wafers 30 are detached from the supports 25 and collected into a stack in the basket 80, they can be manually removed from an opening in the housing 20 (such as from the top), and the basket can then be lowered back through the housing 20 in preparation for stacking more wafers. It can be observed from FIG. 3 that the stacking of wafers 30 can result in wafer-to-wafer contact within the stack. Such contact may be acceptable when stacking scrap wafers for disposal or recycling, and is contemplated within some embodiments of the invention. However, such wafer-to-wafer contact may not always be desirable, for example when the invention is used to stack production wafers. In such a case, the invention includes the use of carbon paper or other material such as spacers that can be placed on the supports 25 prior to inserting the wafers 30 into the housing 20. Wafers can then be simply slid through the transfer guide 60 and onto the carbon paper/spacer, where stacking would then result in a stack comprising alternating layers of carbon paper (or other material) and wafers 30.

The foregoing description, for purposes of explanation, uses specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Obviously many modifications and variations are possible in view of the above teachings. For instance, it has been emphasized above that the invention includes multiple configurations of support structures. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An apparatus for stacking semiconductor wafers, comprising:
    a housing having:
        an open top and open bottom enabling access to an interior cavity of the housing,
        an open side enabling access to the interior cavity, and
        the interior cavity having a plurality of supports spaced at fixed vertical intervals inside the housing enabling a plurality of wafers to be horizontally supported in a vertically spaced apart arrangement, the supports further adapted to enable the plurality of semiconductor wafers to be raised upwardly out of the housing;
    a transfer guide proximate to the open side of the housing, the transfer guide having a plurality of supporting splines arranged in registry with the supports of the housing such that wafers can be slid directly from the splines to an associated set of supports;
    a receptacle for receiving a cassette in a position enabling alignment with the transfer guide, such alignment arranging the wafers such that they are in alignment with the splines of the transfer guide thereby enabling the wafers to be slid directly from the cassette onto an associated set of splines of the transfer guide; and
    an elevator configured to pass upwardly through the open bottom of the housing detaching the semiconductor wafers from the supports and the housing and lifting the wafers upwardly to collect the semiconductor wafers into a stack.

2. The apparatus of claim 1 wherein said each support is a flexible support configured to deform so as to flexibly release each of the semiconductor wafers onto the stack as the elevator passes upward through the interior cavity of the housing.

3. The apparatus of claim 1 wherein said each support is configured to pivotably release said one of the semiconductor wafers onto the stack.

4. The apparatus of claim 1 wherein each semiconductor wafer is supported by a set of at least two flexible supports.

5. The apparatus of claim 1 wherein the elevator comprises a basket configured to move within the housing so as to detach the semiconductor wafers from the housing and collect the semiconductor wafers into the stack.

6. The apparatus of claim 4 wherein each set of at least two flexible supports comprises three flexible supports arranged about the edges of each supported wafer.

7. The apparatus of claim 1 wherein the splines of the transfer guide extend in a horizontal direction a sufficient length to support the wafers in a horizontal orientation as they are transferred through the guide into the interior of the housing.

8. The apparatus of claim 1 further comprising a transfer arm arranged for directing said wafers horizontally through said guide and into said housing.

9. A method of stacking semiconductor wafers, comprising:
- providing a plurality of semiconductor wafers arranged in a cassette;
- providing a wafer stacking apparatus having a housing with an interior cavity that includes a side opening and top and bottom openings and includes supports arranged in the interior cavity that are configured to releasably support the plurality of semiconductor wafers in a vertically separated arrangement, the apparatus further including a transfer guide positioned adjacent to the side opening of the housing and having transfer slots aligned with associated supports of the housing arranged to facilitate the transfer of the wafers from the cassette through the transfer guide into the housing through the side opening and onto the supports;
- arranging the cassette on the wafer stacking apparatus such that it is positioned proximal to the transfer guide and arranged so that the wafers in the cassette are in alignment with transfer slots of the transfer guide;
- transferring the plurality of semiconductor wafers into the housing by horizontally pushing the wafers onto the transfer slots of the transfer guide and through the transfer guide to direct the wafers through the side opening of the housing onto the supports so that the wafers are releasably held by the supports within the housing;
- releasing the plurality of semiconductor wafers from the supports by lifting the wafers upwardly from the supports thereby collecting the plurality of semiconductor wafers into a stack.

10. The method of claim 9 wherein said releasing further comprises flexibly releasing the plurality of semiconductor wafers from flexible supports and onto said stack.

11. The method of claim 9 wherein said releasing further comprises pivotably releasing the plurality of semiconductor wafers from pivotable supports and onto said stack.

12. The method of claim 9 wherein said releasing comprises lifting the wafers from the supports using a lift driven support that moves upwardly through the open bottom of the housing pushing the wafers upward and releasing the wafers from the housing as the lift member elevates thereby stacking the wafers one after the other as the lift rises to push the wafers out of the top opening of the housing.

* * * * *